United States Patent
Zhang et al.

(10) Patent No.: US 9,411,028 B2
(45) Date of Patent: Aug. 9, 2016

(54) MULTIPLE RESONANCE SAMPLE COIL FOR MAGIC ANGLE SPINNING NMR PROBE

(75) Inventors: Wurong Zhang, Andover, MA (US); Michael Fey, Andover, MA (US); Peter Gor'kov, Tallahassee, FL (US)

(73) Assignee: Bruker Biospin Corporation, Billerica, MA (US)

( * ) Notice: Subject to any disclaimer, the term of this patent is extended or adjusted under 35 U.S.C. 154(b) by 702 days.

(21) Appl. No.: 13/447,189

(22) Filed: Apr. 14, 2012

(65) Prior Publication Data

US 2013/0271141 A1   Oct. 17, 2013

(51) Int. Cl.
 *G01R 33/34* (2006.01)
 *G01R 33/36* (2006.01)

(52) U.S. Cl.
 CPC ...... *G01R 33/34092* (2013.01); *G01R 33/3635* (2013.01); *G01R 33/34053* (2013.01); *G01R 33/34061* (2013.01); *G01R 33/34076* (2013.01)

(58) Field of Classification Search
 CPC .............. G01R 33/34053; G01R 33/34061; G01R 33/34076; G01R 33/34092; G01R 33/3635
 USPC ......................................................... 324/318
 See application file for complete search history.

(56) References Cited

U.S. PATENT DOCUMENTS

| | | | | |
|---|---|---|---|---|
| 4,879,515 A | * | 11/1989 | Roemer et al. | 324/318 |
| 5,180,982 A | * | 1/1993 | Zeiger | 324/322 |
| 5,585,723 A | * | 12/1996 | Withers | 324/318 |
| 6,118,274 A | * | 9/2000 | Roffmann et al. | 324/321 |
| 6,316,941 B1 | * | 11/2001 | Fujita et al. | 324/318 |
| 6,380,742 B1 | | 4/2002 | Stringer | |
| 6,522,143 B1 | * | 2/2003 | Fujita et al. | 324/318 |
| 6,806,713 B2 | | 10/2004 | Wong | |
| 7,123,012 B2 | * | 10/2006 | Srinivasan | 324/318 |
| 2009/0160442 A1 | * | 6/2009 | Mazurkewitz et al. | 324/318 |
| 2010/0156414 A1 | | 6/2010 | Sakellariou | |

OTHER PUBLICATIONS

Fey, M. "NMR Hardware Winter School 2010", Presentation by M. Fey 2010.

* cited by examiner

*Primary Examiner* — Dixomara Vargas
(74) *Attorney, Agent, or Firm* — O'Shea Getz P.C.

(57) ABSTRACT

A multiple resonance sample coil for a magic angle spinning nuclear magnetic resonance probe is comprised of a solenoid coil that resonates at low frequencies and a resonator that resonates at high frequencies. The ends of the low frequency solenoid coil are electrically connected to the high frequency resonator to eliminate arcing and allow the solenoid coil to extend the full width of the resonator. In some embodiments, the high frequency resonator is constructed from the outermost turns of the solenoid coil in the form of a birdcage resonator. In another embodiment, the solenoid coil is electrically connected to one turn of the resonator and the other turn is used as part of a trap to shunt the resonator at low frequencies.

4 Claims, 9 Drawing Sheets

MULTIPLE RESONANCE SAMPLE COIL FOR MAGIC ANGLE SPINNING NMR PROBE

BACKGROUND

Nuclear magnetic resonance (NMR) is a physical phenomenon involving quantum mechanical magnetic properties of atomic nuclei in the presence of an applied, external magnetic field. NMR phenomena can be observed with an NMR spectrometer and used to study molecular physics, crystalline and non-crystalline materials. In particular, nuclear spin phenomena can be used to generate a spectrum comprised of a pattern of lines representing the various nuclear spins and spin interactions.

In order to perform an NMR experiment, a sample is placed in the external or $B_0$ magnetic field to create a net magnetization in the sample. A radio-frequency (RF) field or $B_1$ field is then applied to the sample to rotate the net magnetization in a pulse sequence. Sample coils that surround the sample not only create the $B_1$ field for the pulse sequence, but also detect the NMR signal from the sample.

Single or multiple sample coil combinations can be used. The set of coils must be configured so that, for each nucleus to be observed, a resonance frequency similar to the Larmor frequency of the nucleus is created. Single coils may formed exclusively from wire (a mainly inductive element, which can be used, for example, for broad banded applications) or as a combination of inductive and capacitive elements that form a resonator at a given frequency. Since the presence of the sample affects the resonant frequency of the coils, the resonances have to be tuned for the specific sample being studied in order to achieve the highest signal-to-noise ratios. Another requirement of a sample coil is that the $B_1$ field produced by the coil must be homogeneous over the volume of the sample. If the $B_1$ field is not constant, the magnetization will be rotated by a distribution of rotation angles and the resulting spectra will be distorted.

NMR experiments can be performed on both liquid and solid samples. Spatial proximity and/or a chemical bond between two atoms can give rise to interactions between the nuclei of the atoms. In general, these interactions are orientation dependent. In an NMR experiment involving a liquid sample, Brownian motion of the molecules and atoms causes an averaging of anisotropic interactions. In such cases, these interactions can be neglected on the time-scale of the NMR experiment. However, in solid samples, for example crystals, powders and molecular aggregates, the anisotropic interactions between nuclei have a substantial influence on the behavior of a system of nuclear spins. In particular, in solid materials, the great number of interactions produces very broad and featureless NMR result lines. However, the interactions are time-dependent and can be averaged by physically spinning the sample (at high rotation speeds up to 80 kHz) at an inclination of the so-called magic angle (54.74°) with respect to the direction of the external $B_0$ magnetic field. The averaging causes the normally broad lines become narrower, increasing the resolution for better identification and analysis of the spectrum.

To perform a magic angle spinning (MAS) nuclear magnetic resonance experiment, a sample is typically packed into a rotor that fits inside the sample coil and is rotated at high speed by an air turbine. The rotor is held in place by air bearings. The entire structure is then inserted into the bore of a high strength magnet. This design places stringent considerations on the sample coil size and location.

Due to the very restricted space between the air bearings and the high strength $B_1$ fields and thus high power requirements, a number of coil designs are used to provide "optimal" performance. With the "best" filling factor in this configuration, a solenoid coil was the coil of choice for some time. In the last decade experiments on biosol id samples have been performed with the drawback of lossy (usually salty) samples that absorb energy and heat the sample while destroying the biomass inside. Several different coils have been developed including a "cross coil" version with some success. These two coil systems consists of two separate coils, one high frequency resonator with a reduced E-field (the E-field causes heating) and one highly efficient solenoid coil for the lower frequencies.

To make matters more complicated, many present day experiments require NMR probes with sample coils tuned to several different frequencies so that $B_1$ energy at these frequencies can be applied simultaneously to the sample or at least applied sequentially without removing the sample from the magnet bore. For example, a typical triple resonant probe might have sample coils tuned to the Larmor frequencies of $^{13}C$, $^{15}N$ and $^{1}H$ atoms. At a $B_0$ field strength of 18.8 Tesla, these Larmor frequencies correspond to 200, 80, and 800 MHz, respectively. Due to the large difference in Larmor resonant frequency between the $^{15}N$ and $^{1}H$ atoms, a two coil "cross coil" structure is generally used to separate the frequencies. Isolation of the three NMR signals generated during the NMR experiment is achieved using different approaches, including rejection traps, geometrically decoupled coils or transmission lines that pass different wavelengths.

Figure 1:
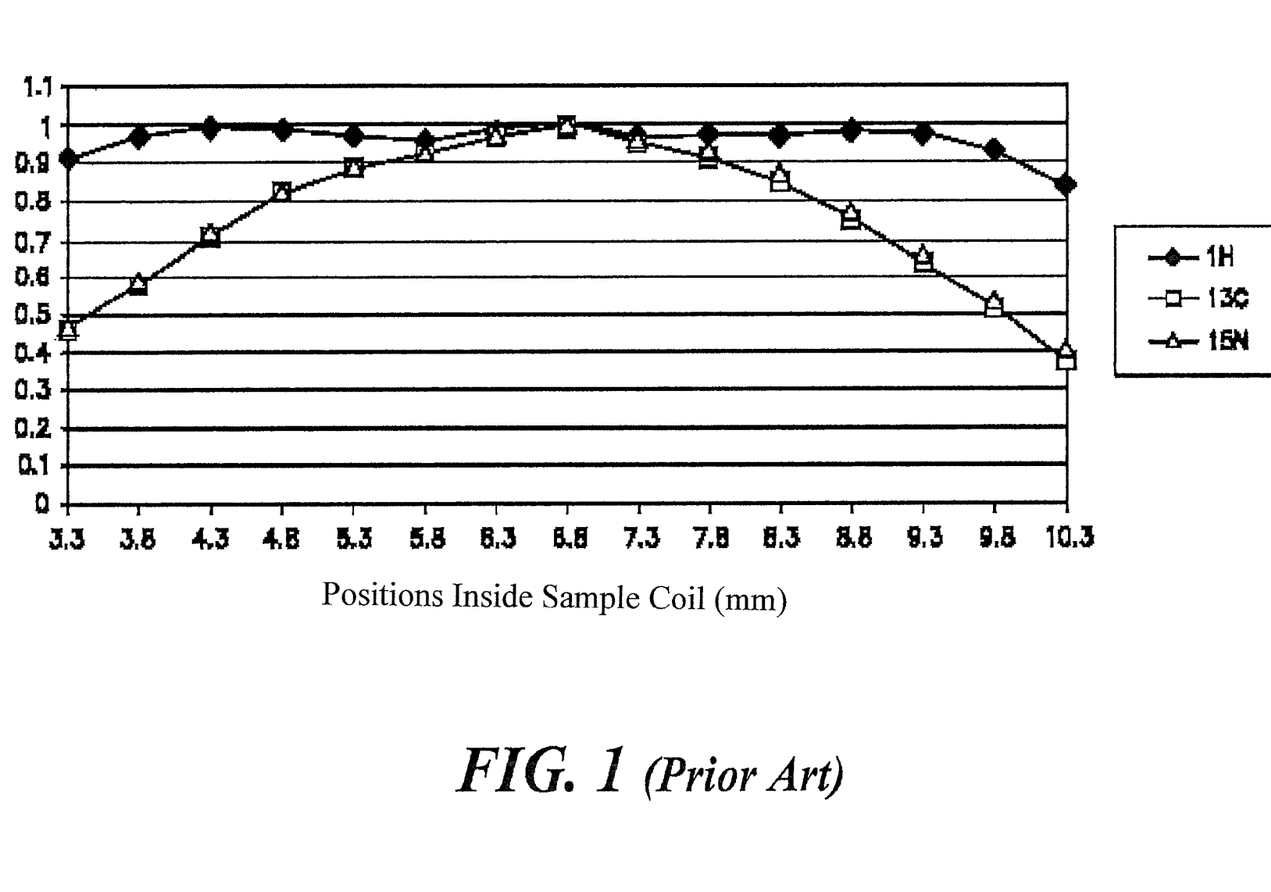
FIG. 1 is a graph of $B_1$ field strength inside of the sample coil in a conventional sample coil system.

However, the conventional two coil approach has significant problems with uniformity of the $B_1$ field inside of the sample coil. More specifically, the high frequency and low frequency coils are not connected together so that a potential difference develops between the ends of the solenoid coil and the Helmholtz coils which can cause arcing. Experiments on solids need high $B_1$ fields for long time intervals which also increases the chance of arcing in these applications. Therefore, in order to reduce arcing between the coils either the $B_1$ field strength must be limited and/or a significant space must be left between the ends of solenoid coil and the high frequency resonator. Since the overall size of the coil structure is limited by other factors, the result is that the length of the solenoid coil is reduced. FIG. 1 is a graph of the $B_1$ field strength inside of a conventional sample coil configuration. The horizontal axis is the position inside of the coils measured from one in millimeters with the center of the coils occurring at 6.8 mm. The vertical axis indicates the $B_1$ field strength normalized to the field strength at the center of the coils. The graph represented by the filled diamonds is the $B_1$ field strength at the $^{1}H$ frequency; the graph represented by the hollow squares is the $B_1$ field strength at the $^{13}C$ frequency and the graph represented by the hollow triangles is the $B_1$ field strength at the $^{15}N$ frequency. As can be seen from the graphs, the field strength at the $^{1}H$ frequency is relatively flat over the range of 3.3 mm to 10.3 mm. However the $^{13}C$ and $^{15}N$ field strengths fall off rapidly away from the center position of the coil system due to the restricted length of the coil. In general, a variation of the $B_1$ field strength of more than ten percent is not tolerable for the reasons discussed above. Therefore, as shown in the figure, the usable area of the coil system extends only from 5.8 mm to 7.8 mm or a total of 2 mm. This usable area severely restricts the sample size.

Therefore, there is a need for an improved multiple resonant coil design.

SUMMARY

In accordance with the principles of the invention, the resonator and the solenoid coil are combined such that, at the ends, both use the same conductive material, i.e. are electrically connected together. This eliminates arcing between the coils and allows the solenoid coil to extend the full width between the high frequency resonator turns.

In one embodiment, a single solenoid coil is used to electrically create both a solenoid coil for low frequency $B_1$ fields and a high frequency resonator in the form of a "birdcage" resonator for the high frequency $B_1$ field. A plurality of discrete capacitors are connected across the outermost turns of the solenoid coil. The capacitors are connected around the outermost turns of the solenoid coil so that, at high frequency, the low impedance of the capacitors creates the birdcage resonator from sections of the outermost solenoid coils and the capacitors. At low frequency, the high impedance of the capacitors allows the solenoid coil to generate the low frequency $B_1$ field.

In a second embodiment, the solenoid coil is center tapped and split into two sections which are wound in opposing directions. As in the first embodiment, a plurality of capacitors are connected across the outermost turns of the solenoid coil. The capacitors are connected around the outermost turns of the solenoid coil so that, at high frequency, the low impedance of the capacitors creates Helmholtz coils from sections of the outermost solenoid coils. At low frequency, a trap connected across the ends of the solenoid coil shorts the ends of the coil together to effectively remove the capacitors from the low frequency circuit. With the ends of the solenoid coil connected together, the coil sections are connected in parallel, but because the sections are wound in opposing directions, the $B_1$ field is in the same direction in both sections. The low frequency circuits are connected to the center tap of the solenoid coil.

In a third embodiment, similar to the previous embodiment, a center-tapped two-section solenoid coil is used for low frequencies. Instead of capacitors, a high frequency resonator with two turns is used for high frequencies. The solenoid is connected across one turn of the resonator. A capacitor connected across the resonator together with the other turn of the resonator forms the trap of the previous embodiment. As with the previous embodiment, the low frequency circuits are connected to the center tap of the solenoid coil.

DETAILED DESCRIPTION

Figure 2:
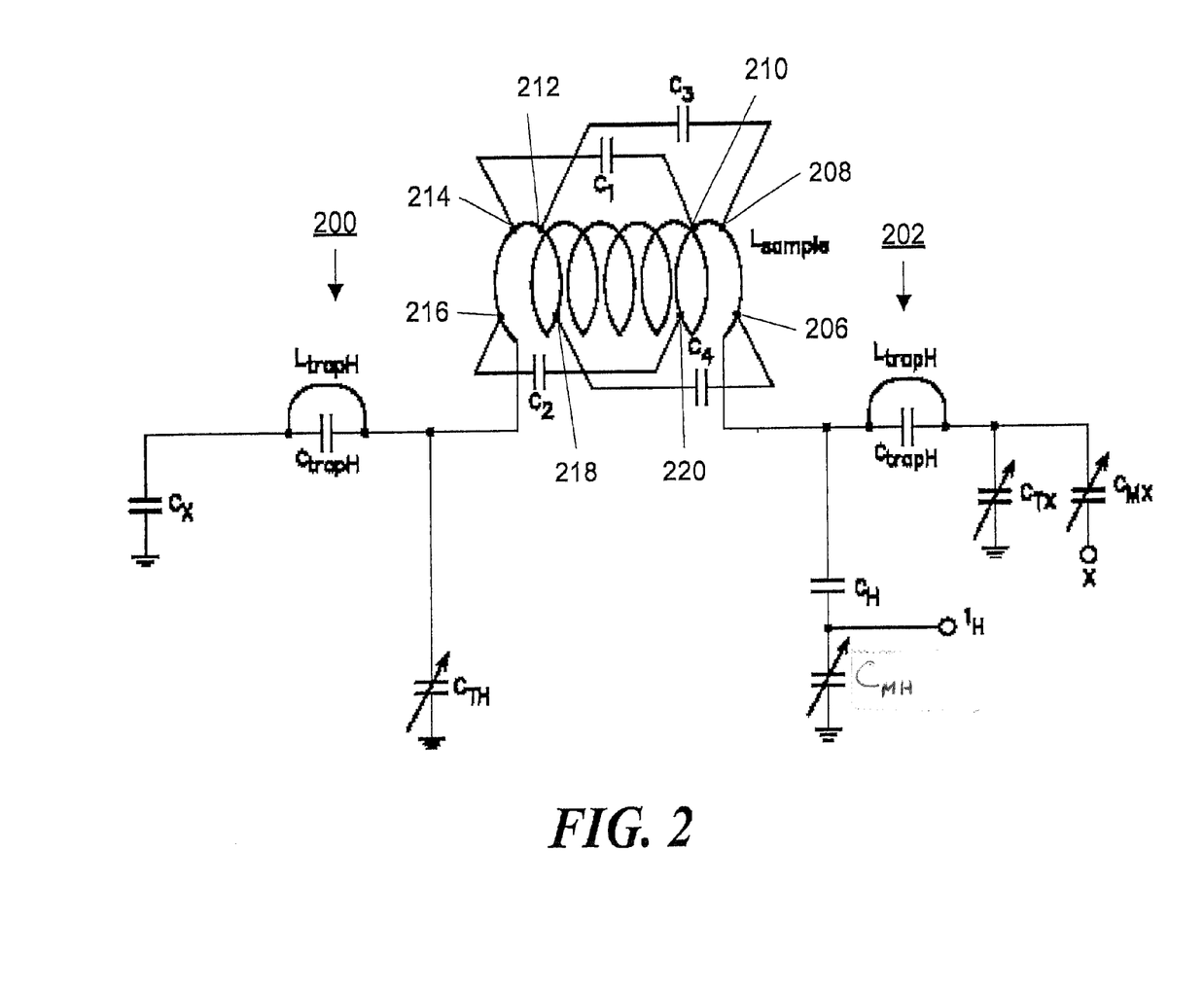
FIG. 2 is an electrical circuit schematic in accordance with a first embodiment of the invention.
Figure 3:
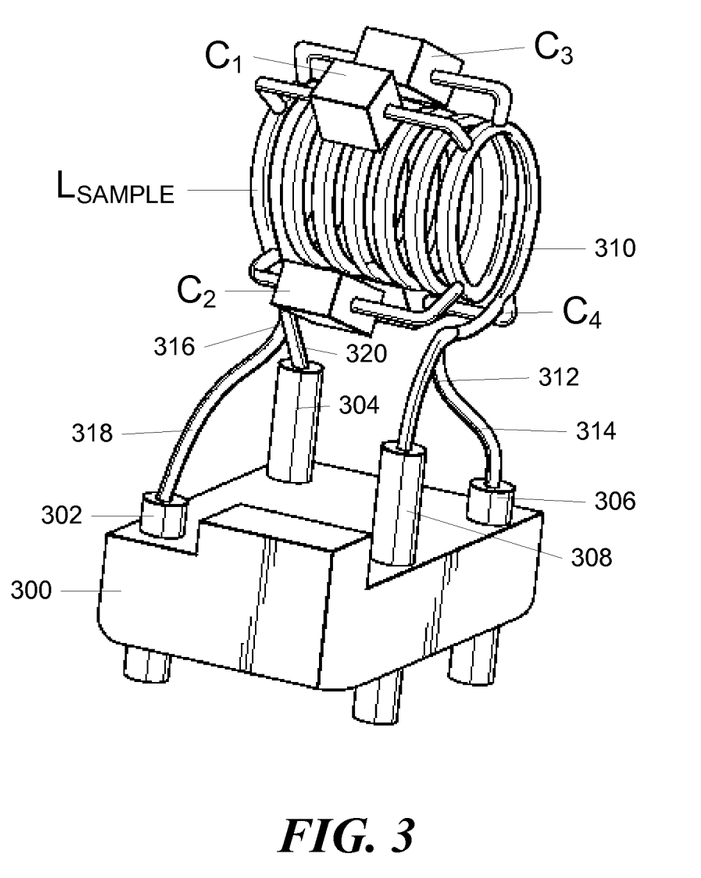
FIG. 3 is a perspective drawing of the physical components of the circuit shown in FIG. 2 mounted on a convention ceramic base.

FIG. 2 shows a circuit schematic of a circuit that is useful for double resonance applications that require both a $^1H$ frequency signal and a lower frequency resonance signal, such as $^{15}N$ resonance signal, which signal is indicated as "X" in FIG. 2. FIG. 3 shows a perspective view of an exemplary arrangement of the respective physical circuit parts for the circuit shown in FIG. 2. In these figures $L_{sample}$ is the solenoid coil. $C_1$, $C_2$, $C_3$ and $C_4$ are identical capacitors, illustrated in FIG. 3 as chip capacitors, which are connected across the solenoid coil $L_{sample}$. The angle between the capacitor wires at the point where they connect to solenoid coil outermost turns can be optimized for homogeneity or strength or a combination of both. As an example, the wires could be connected around the outermost turn at points 208, 206, 220 and 210 at 60°, 120°, 180° and 300°, respectively, but other angles can also be used. Similarly, the capacitors are connected to the opposing outermost coil of $L_{SAMPLE}$ at points 212, 218, 216 and 214. In addition, although four capacitors are shown in the figure, more than four connections can be used for improved homogeneity.

At the $^1H$ frequency the capacitors form low impedance paths across the solenoid coil $L_{SAMPLE}$ so that only portions of the outmost turns of the solenoid coil are part of the $^1H$ circuit. At the $^1H$ frequency, the capacitors (and the connecting wires) and the portions of the outmost turns of the solenoid coil form a bird cage resonator. The high inductance of the solenoid coil effectively "stops" the $^1H$ frequency so that the solenoid coil is not part of the $^1H$ circuit.

Therefore, the $^1H$ circuit is formed from portions of the outermost turns of the sample coil $L_{sample}$, capacitors $C_1$, $C_2$, $C_3$ and $C_4$ and capacitors $C_{TH}$, $C_H$ and $C_{MH}$. The values of capacitors $C_1$, $C_2$, $C_3$ and $C_4$ are chosen so that the self-resonance frequency of the circuit including the sample coil portions plus the capacitors is high enough to tune the circuit to the $^1H$ frequency, but low enough to maximize the $^1H$ channel efficiency. Capacitor $C_H$ is a fixed value capacitor used to adjust the $^1H$ frequency for matching. Capacitor $C_{TH}$ is an adjustable $^1H$ tuning trimmer capacitor and capacitor $C_{MH}$ is an adjustable matching trimmer capacitor. The 1H frequency is taken from the terminal $^1H$.

At the low frequency, the capacitors $C_1$, $C_2$, $C_3$ and $C_4$ are effectively open and the low frequency circuit consists of the entire inductance of the sample coil $L_{sample}$, and capacitors $C_{TX}$, $C_X$ and $C_{MX}$. Capacitor $C_X$ is a fixed value capacitor used to adjust the X frequency. Capacitor $C_{TX}$ is an adjustable X frequency tuning trimmer capacitor and capacitor $C_{MX}$ is an adjustable matching trimmer capacitor. The X frequency is taken from the terminal X.

The low X frequency circuit is isolated from the $^1H$ frequency circuit by traps 200 and 202. Each trap consists of a small half-turn inductor $L_{TRAPH}$ connected in parallel with a capacitor $C_{TRAPH}$. This trap circuit resonates at the $^1H$ frequency and isolates the X-channel circuit.

FIG. 3 shows an illustrative arrangement of the circuit components shown in FIG. 2 on a conventional ceramic base 300 of the type used in magic-angle spinning NMR experiments. The base 300 has four feedthroughs 302-308. The end 310 of sample coil $L_{SAMPLE}$ is connected to feedthrough 308 by lead 312 and to feedthrough 306 by lead 314. Similarly, end 316 of sample coil $L_{SAMPLE}$ is connected to feedthrough 302 by lead 318 and to feedthrough 304 by lead 320. The remainder of the circuit components (not shown in FIG. 3) are connected to the underside of the feedthroughs 302-308. For example, capacitors $C_H$ and $C_{MH}$ and the $^1H$ terminal might be connected to terminal 308 and trap 202, capacitors $C_{TX}$, and $C_{MX}$ and the X frequency terminal might be connected to feedthrough 306. Similarly, capacitor $C_{TH}$ can be connected to terminal 302 and trap 200 and capacitor $C_X$ can be connected to terminal 304.

Since both modes (the $^1$H bird cage mode and the low frequency solenoid mode) share the last turn together, the solenoid coil $L_{SAMPLE}$ can be made considerably longer than is possible with the conventional two-coil system and is limited by the physical constraints introduced by the magic angle spinning system. The circuit shown in FIGS. 2 and 3 is effective for high and low $B_1$ field frequencies such as $^1$H and $^{15}$N. However, the capacitors $C_1$, $C_2$, $C_3$ and $C_4$ lower the self resonance of the coil $L_{SAMPLE}$ at low frequencies so that self resonance at an intermediate frequency, such as the $^{13}$C frequency, cannot be obtained with reasonable efficiency.

Figure 4:
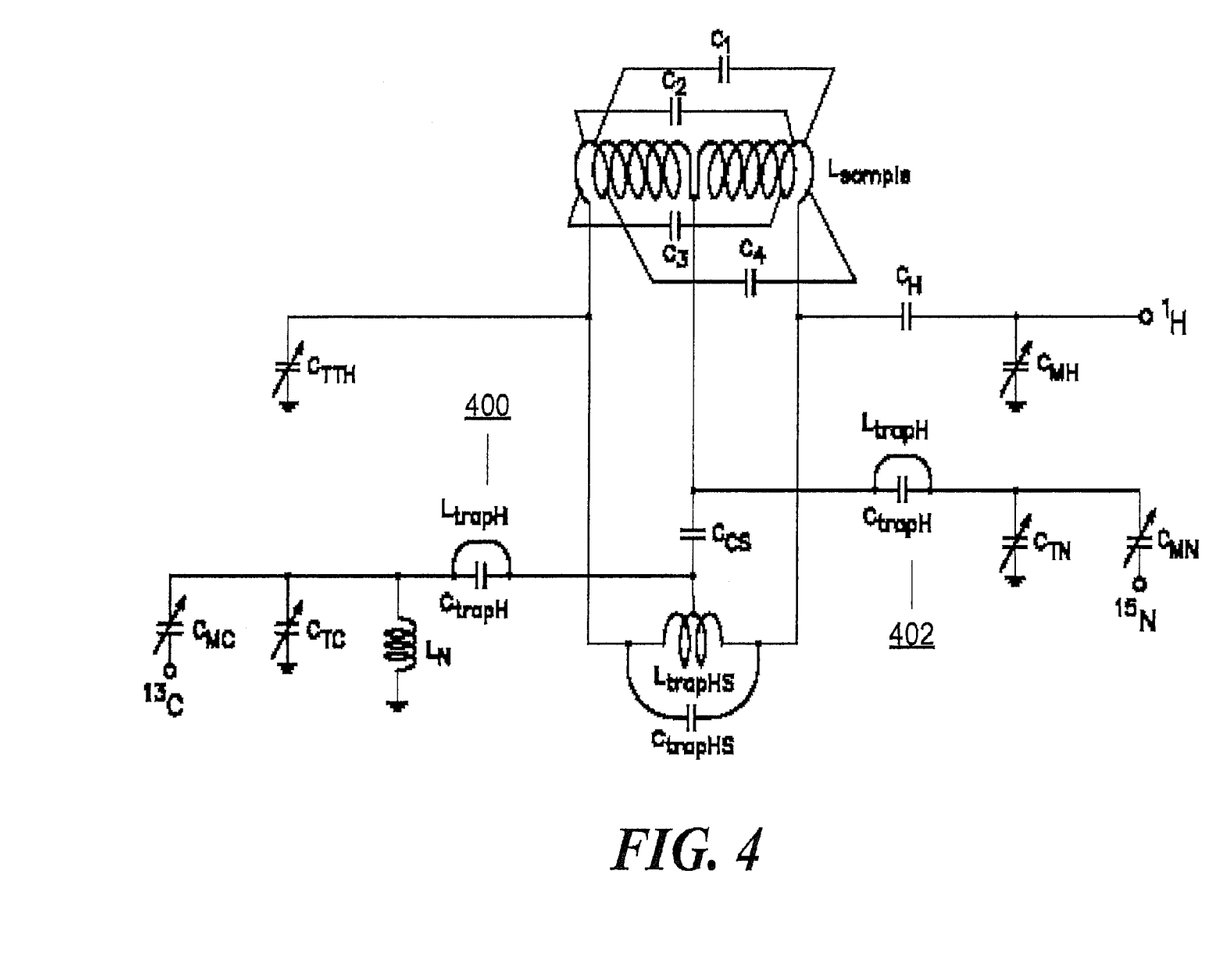
FIG. 4 is an electrical circuit schematic in accordance with a second embodiment of the invention.
Figure 5:
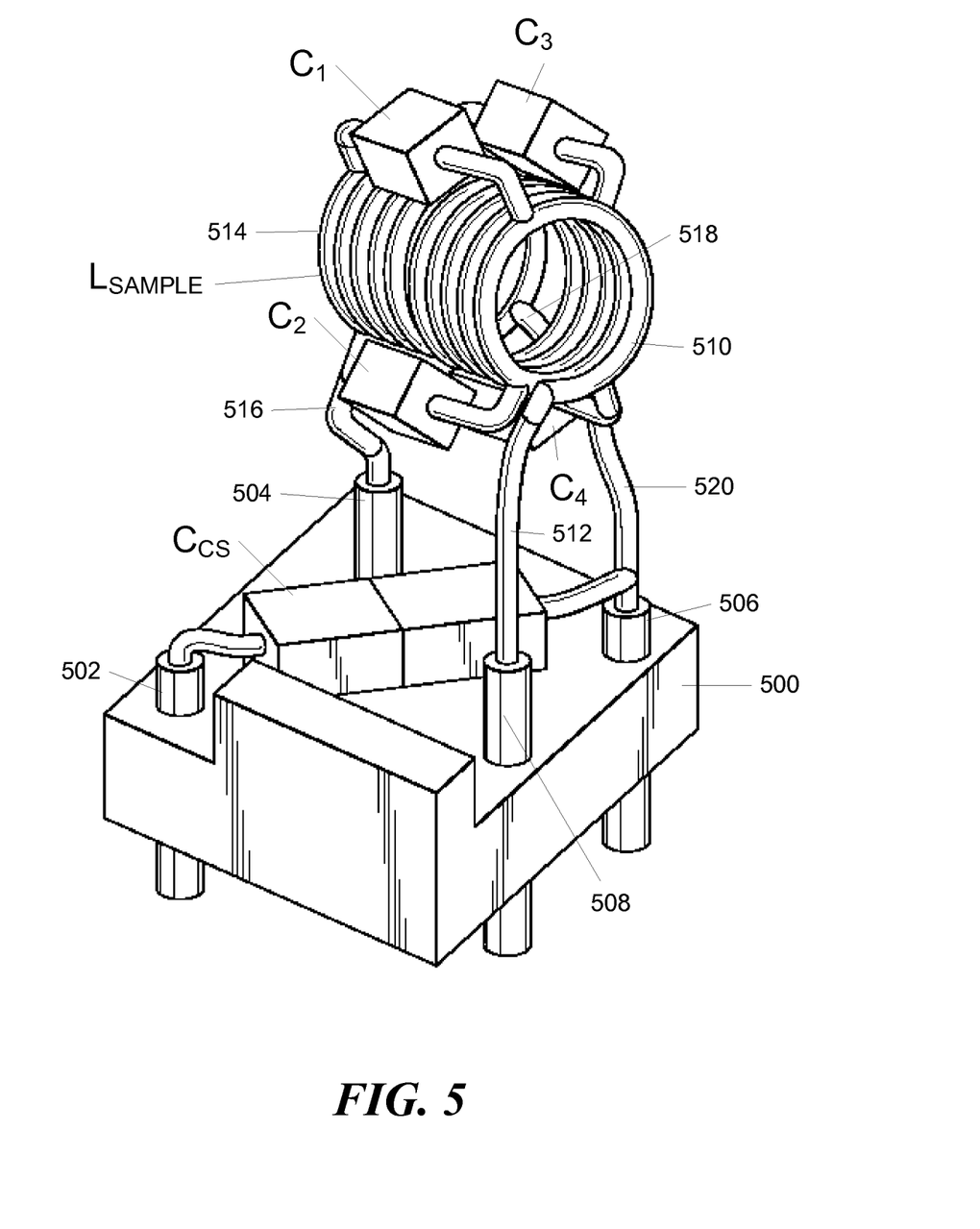
FIG. 5 is a perspective drawing of the physical components of the circuit shown in FIG. 4 mounted on a convention ceramic base.
Figure 6:
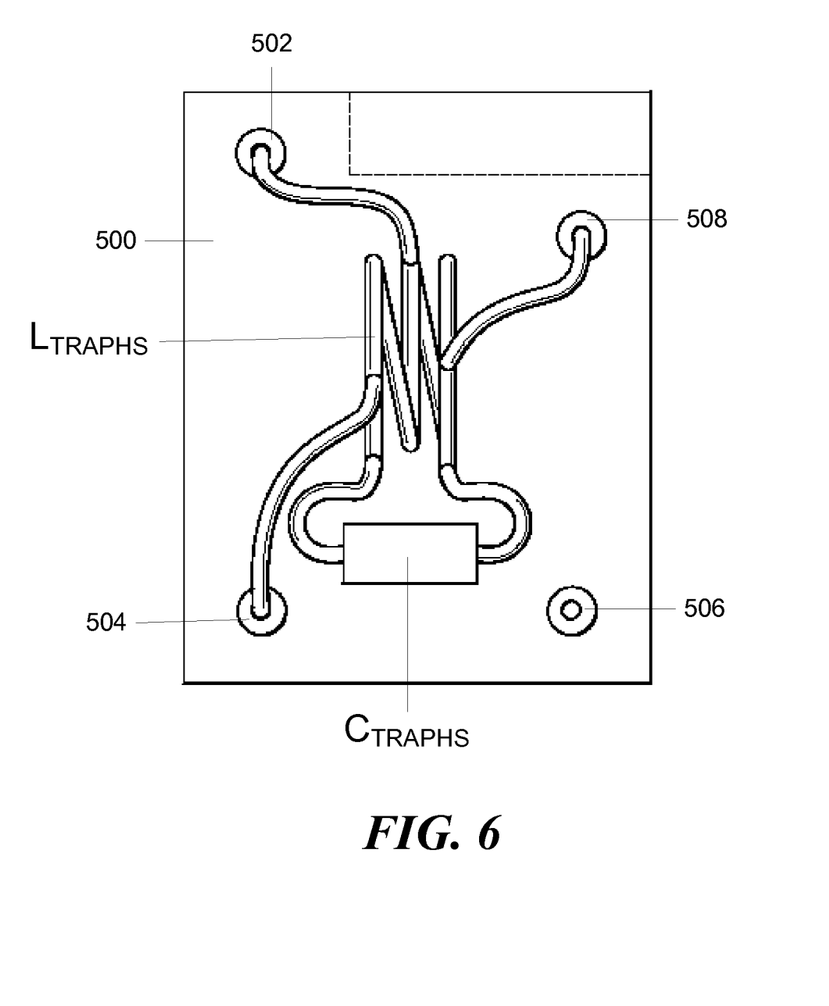
FIG. 6 is a plan view of the underside of the ceramic base shown in FIG. 5 illustrating a trap inductor and capacitor.

FIG. 4 shows a circuit schematic of a second embodiment of the invention that is useful for triple resonance applications. The most frequently used application requires a $^1$H frequency signal, a $^{13}$C frequency signal and a $^{15}$N resonance signal, but the circuit can be used for other triple resonance combinations of single frequency nuclei. FIGS. 5 and 6 shows a perspective view and a bottom view of an exemplary arrangement of the respective physical circuit parts. In these figures $L_{sample}$ is a center tapped solenoid coil in which the two coil sections are wound in opposing directions.

For the 1H circuit, the capacitors $C_1$, $C_2$, $C_3$ and $C_4$ and the sample coil $L_{SAMPLE}$ are connected, and function, in the same manner as described with respect to FIG. 2. Therefore, the $^1$H circuit is formed from portions of the outermost turns of the sample coil $L_{sample}$, capacitors $C_1$, $C_2$, $C_3$ and $C_4$ and capacitors $C_{TH}$, $C_N$ and $C_{MH}$ and operates as described with respect to FIG. 2.

The center tapped solenoid is operated as two parallel coils from the center tap to the outside ends. As such, the both sides of the coil are on the same or similar potential which eliminates the effects of the capacitors $C_1$, $C_2$, $C_3$ and $C_4$ on the self resonant frequency of the coil $L_{SAMPLE}$ at the lower frequencies. Since the two outer leads of the tapped solenoid must be connected for parallel operation this would generate a short at the $^1$H frequency. The inductor $L_{TRAPHS}$ and capacitor $C_{TRAPHS}$ thus form a $^1$H trap connected across the sample coil $L_{SAMPLE}$ so that the ends of the sample coil are effectively shorted together for frequencies in the $^{13}$C and $^{15}$N channels but are not shorted at the $^1$H frequency. With the ends of the solenoid coil connected together, the coil sections are connected in parallel, but because the sections are wound in opposing directions, the $B_1$ field is in the same direction in both sections. The low frequency circuits are connected to the center tap of the solenoid coil so that the self resonance frequency of the sample coil for the $^{13}$C and $^{15}$N channels is determined by the capacitor $C_{CS}$ and the full inductance of the sample coil $L_{SAMPLE}$ and is chosen to be close to the $^{13}$C frequency. The low frequency circuits are isolated from the $^1$H frequency circuit by traps 400 and 402. Each trap consists of a small half-turn inductor $L_{TRAPH}$ connected in parallel with a capacitor $C_{TRAPH}$. The trap circuits resonate at the $^1$H frequency and isolate the $^{13}$C and $^{15}$N channel circuits.

The $^{13}$C frequency circuit consists of the sample coil $L_{sample}$, and capacitors $C_{TC}$, and $C_{MC}$. Capacitor $C_{TC}$ is an adjustable $^{13}$C frequency tuning trimmer capacitor and capacitor $C_{MN}$ is an adjustable matching trimmer capacitor. The $^{13}$C frequency is taken from the terminal $^{13}$C.

The $^{15}$N frequency circuit consists of the sample coil $L_{sample}$, and capacitors $C_{TN}$, and $C_{MN}$. Capacitor $C_{TN}$ is an adjustable $^{15}$N frequency tuning trimmer capacitor and capacitor $C_{MN}$ is an adjustable matching trimmer capacitor. The $^{15}$N frequency is taken from the terminal $^{15}$N. Inductor $L_N$ provides a ground path for the $^{15}$N channel. However, since it is in parallel with the $^{13}$C frequency tuning trimmer capacitor $C_{TC}$ it also affects the $^{13}$C tuning and efficiency.

Therefore, the value of inductor $L_N$ must be chosen with consideration of the tuning and efficiency of both the $^{13}$C and $^{15}$N channels.

FIG. 5 shows an illustrative arrangement of the physical circuit components shown in FIG. 4 on a conventional ceramic base 500 and FIG. 6 shows a bottom view of the base 500. The base 500 has four feedthroughs 502-508. The end 510 of sample coil $L_{SAMPLE}$ is connected to feedthrough 508 by lead 512. Similarly, end 514 of sample coil $L_{SAMPLE}$ is connected to feedthrough 502 by lead 516. The center tap 518 of coil $L_{SAMPLE}$ is connected to feed through 506 by lead 520. The capacitor $C_{CS}$ is shown as two chip capacitors connected together, but may be a single capacitor. The remainder of the circuit components (not shown in FIG. 5) are connected to the underside of the feedthroughs 502-508. For example, capacitors $C_H$ and $C_{MH}$ and the $^1$H terminal might be connected to terminal 508 and trap 402, capacitors $C_{TN}$, and $C_{MN}$ and the $^{15}$N frequency terminal might be connected to feedthrough 506. Similarly, capacitor $C_{TH}$ can be connected to terminal 504 and trap 400, capacitors $C_{MC}$ and $C_{TC}$ and inductor $L_N$ can be connected to terminal 502. FIG. 6 shows the underside of base 500 illustrating the trap formed by inductor $L_{TRAPHS}$ and capacitor $C_{TRAPHS}$.

Figure 7:
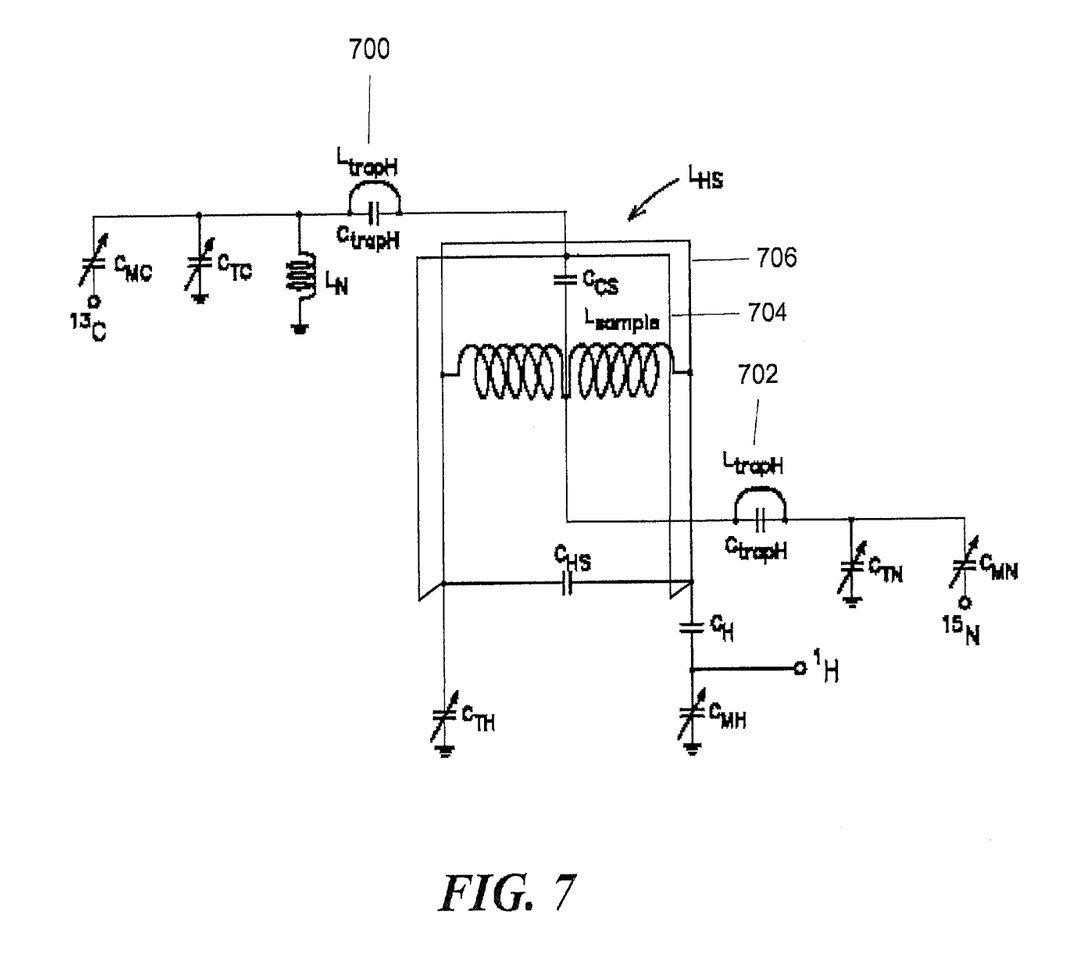
FIG. 7 is an electrical circuit schematic in accordance with a third embodiment of the invention.

FIG. 7 shows a circuit schematic of a third embodiment of the present invention which is a simplified version of the circuit illustrated in FIG. 4. This circuit can also be used for triple resonance applications, such as $^1$H, $^{13}$C and $^{15}$N resonances. Similar to the previous embodiments, this circuit uses both a solenoid coil and a two-turn high frequency resonator. The turns 704 and 706 in a Helmholtz configuration are only interrupted once by capacitors rather than twice as in the previous embodiments. In this configuration, the inductance of the two parallel turns 704 and 706 forms the inductance $L_{HS}$. Since the outer ends of the center tapped solenoid are now connected by wire only (capacitors $C_2$ and $C_1$ have been effectively removed), the $^1$H trap consists of the inductance $L_{TRAPHS}$; capacitor $C_{TRAPS}$ is no longer needed. If the connection and turn direction are properly chosen, almost one turn can be gained since in this case, the solenoid uses the last coil from the outermost coil (in contrast to the embodiments discussed above where the $^1$H resonator used the outermost turns from the solenoid).

In the circuit shown in FIG. 7, the capacitance values of capacitors $C_1$, $C_2$, $C_3$ and $C_4$ shown in FIG. 4 have been combined into the capacitance value of capacitor $C_{HS}$ shown in FIG. 7. Inductor $L_{HS}$ and capacitor $C_{HS}$ form a $^1$H frequency coil resonator. The $^1$H frequency coil resonator is connected across the sample coil $L_{SAMPLE}$ so that the ends of the sample coil are effectively shorted together for frequencies in the $^{13}$C and $^{15}$N channels but are not shorted at the $^1$H frequency.

The sample coil $L_{SAMPLE}$ is a center tapped sample coil in which the two coil sections are wound in opposing directions which functions in the same manner as discussed above. The ends of coil $L_{SAMPLE}$ are connected to the ends of resonator turn 704. The capacitor $C_{CS}$ is connected to the center tap of sample coil $L_{SAMPLE}$ and the center of inductor $L_{HS}$. Capacitor $C_{CS}$ and the sample coil $L_{SAMPLE}$ determine the self-resonance frequency of the sample coil for the $^{13}$C and $^{15}$N channels. This self-resonance frequency is usually set to be close to the $^{13}$C resonance frequency. The remaining circuit components have the same functions as the corresponding components shown in FIG. 4.

Figure 8:
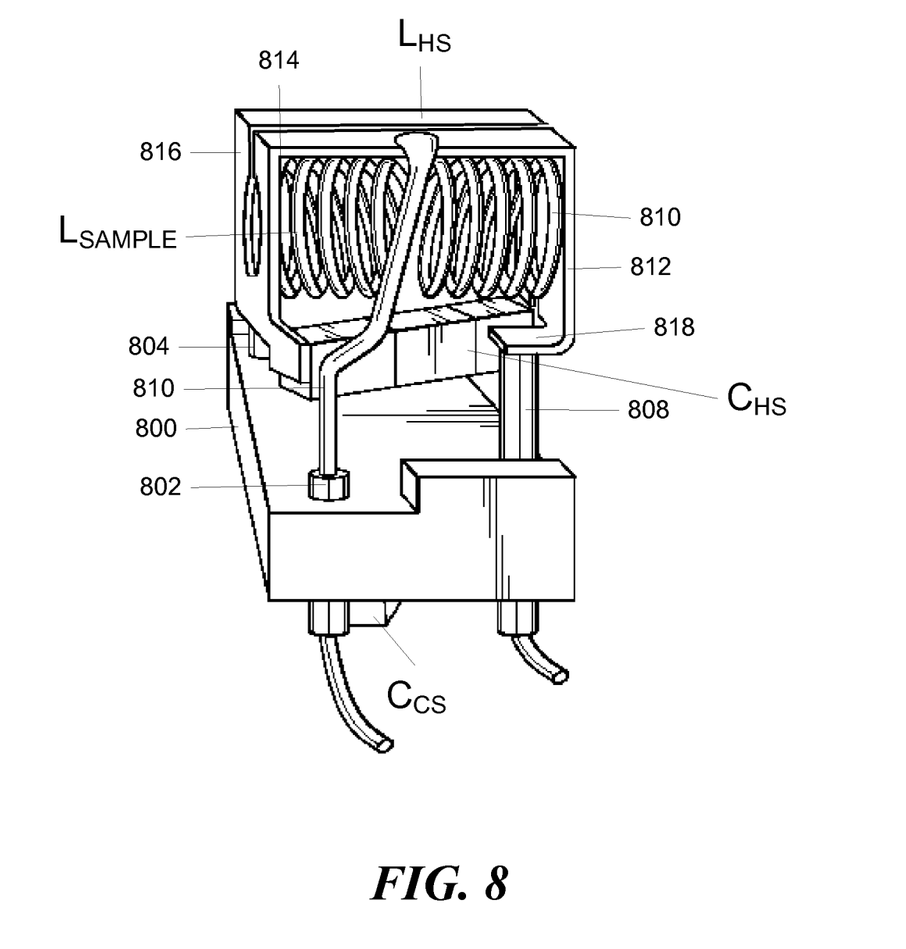
FIG. 8 is a perspective drawing of the physical components of the circuit shown in FIG. 7 mounted on a convention ceramic base.

FIG. 8 physical circuit components shown in FIG. 7 on a conventional ceramic base 800. The base 800 has four feedthroughs 802-808. The end 810 of sample coil $L_{SAMPLE}$ and the end 812 of the inductor $L_{HS}$ are connected to feedthrough 808 by flange 818. Similarly, end 814 of sample coil $L_{SAMPLE}$ and the end 816 of the inductor $L_{HS}$ are connected to feedthrough 804 by a similar flange (not shown in FIG. 8). The center tap of sample coil $L_{SAMPLE}$ is connected to a feedthrough (both not shown in FIG. 8). The capacitor $C_{HS}$ is shown as three chip capacitors connected together, but may be a single capacitor and is connected to the ends of inductor $L_{HS}$. The inductor $L_{HS}$ has a center tap connected to feedthrough 802. The remainder of the circuit components (not shown in FIG. 8) are connected to the underside of the feedthroughs 802-808. For example, capacitors $C_H$ and $C_{MH}$ and the $^1$H terminal are connected to terminal 808 and trap 702, capacitors $C_{TN}$, and $C_{MN}$ and the $^{15}$N frequency terminal might be connected to feedthrough that is connected to the center tap of sample coil $L_{SAMPLE}$. Similarly, capacitor $C_{TH}$ can be connected to terminal 804 and trap 700, capacitors $C_{MC}$ and $C_{TC}$ and inductor $L_N$ can be connected to terminal 802.

Figure 9:
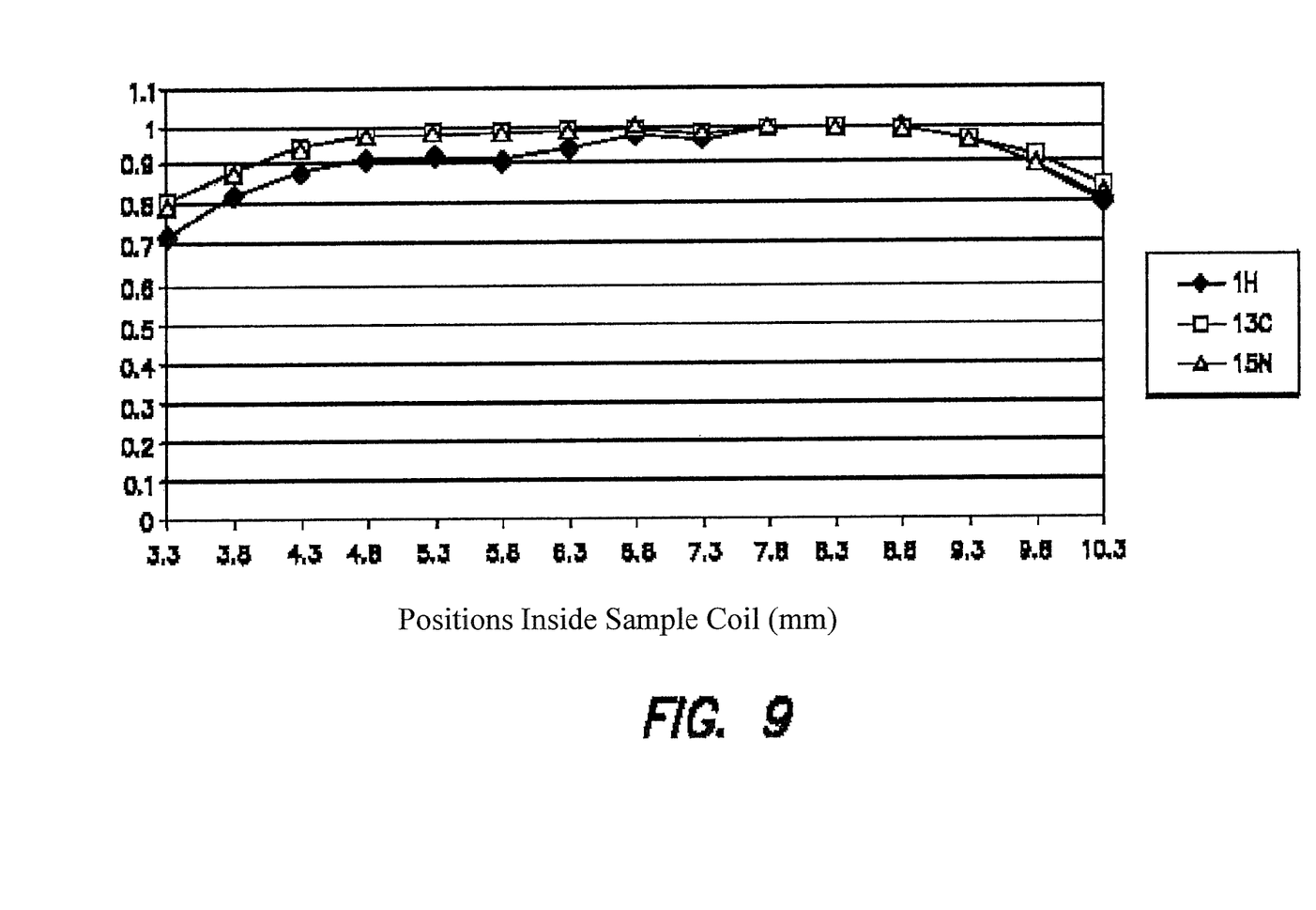
FIG. 9 is a is a graph of $B_1$ field strength inside of the sample coil in the embodiments shown in FIGS. 7 and 8.

FIG. 9 is a graph on the $B_1$ field strength inside of the coil embodiment shown in FIGS. 7 and 8. The horizontal axis is the position inside of the coils measured from one in millimeters with the center of the coils occurring at 6.8 mm. The vertical axis indicates the $B_1$ field strength normalized to the field strength at the center of the coils. The graph represented by the filled diamonds is the $B_1$ field strength at the $^1$H frequency; the graph represented by the hollow squares is the $B_1$ field strength at the $^{13}$C frequency and the graph represented by the hollow triangles is the $B_1$ field strength at the $^{15}$N frequency. As can be seen from the graphs, the field strength at the $^1$H frequency is relatively flat over the range of 4.3 mm to 9.3 mm. Therefore, as shown in the figure, the usable area of the coil system extends from 4.3 mm to 9.3 mm or a total of 5 mm which is approximately two and one half times the usable area of a conventional coil.

Although the inventive configurations have been shown for use with magic angle spinning NMR probes, the inventive design can also be used with static probes that do not use magic angle spinning. In addition, the number, form and position of the connecting wires can vary dependent on application, available space and performance.

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. A multiple resonance sample coil for a magic angle spinning NMR probe comprising:
    a first RF coil comprising at least one solenoid coil resonant at a first frequency and that generates a main magnetic field component in an axial direction of a coil axis and having a first and a second outermost turn; and
    a second RF coil resonant at a second frequency higher than the first frequency, configured and arranged to create a main magnetic field component perpendicular to the axial direction, where the first and second outermost turns of the first RF coil are directly connected electrically to the second RF coil.

2. The multiple resonance sample coil of claim 1, where the second coil comprises a plurality of capacitors that are connected between the first outermost turn and the second outermost turn of the first coil such that at the second frequency, the first and second outermost turns of the solenoid and the plurality of capacitors form a birdcage resonator.

3. The sample coil of claim 1 wherein the first coil is center tapped and split in two sections that are wound in opposing directions acting as parallel solenoids wherein the two outermost turns are connected by a trap that block the high frequency of the second coil.

4. The sample coil of claim 3 wherein the second coil comprises a parallel Helmholtz coil and last turns of two parallel solenoid coils of the first coil comprise a portion of the Helmholtz coil.

* * * * *